United States Patent [19]

Ukai

[11] Patent Number: 4,994,401

[45] Date of Patent: Feb. 19, 1991

[54] METHOD OF MAKING A THIN FILM TRANSISTOR

[75] Inventor: Yasuhiro Ukai, Kobe, Japan

[73] Assignee: Hosiden Electronics Co., Ltd., Osaka, Japan

[21] Appl. No.: 498,641

[22] Filed: Mar. 26, 1990

Related U.S. Application Data

[62] Division of Ser. No. 140,688, Jan. 4, 1988, Pat. No. 4,943,838.

[30] Foreign Application Priority Data

Jan. 16, 1987 [JP] Japan ................................ 62-7657

[51] Int. Cl.$^5$ ........................................... H01L 29/78
[52] U.S. Cl. ...................................... 437/40; 437/24; 437/37; 437/229; 437/235
[58] Field of Search ................... 437/24, 37, 43, 40, 437/41, 235, 229; 357/2, 4, 23.7, 61

[56] References Cited

U.S. PATENT DOCUMENTS

| 4,332,075 | 6/1982 | Ota et al. | 437/41 |
| 4,398,340 | 8/1983 | Brown | 437/41 |
| 4,459,739 | 7/1984 | Shepherd et al. | 357/23.7 |
| 4,502,204 | 3/1985 | Togashi et al. | 357/23.7 |
| 4,727,044 | 2/1988 | Yamazaki | 357/23.7 |
| 4,733,284 | 3/1988 | Aoki | 357/23.7 |
| 4,746,628 | 5/1988 | Takafuji et al. | 437/187 |
| 4,822,751 | 4/1989 | Ishizu et al. | 357/23.7 |
| 4,849,797 | 7/1989 | Ukai et al. | 357/23.7 |

FOREIGN PATENT DOCUMENTS

| 0141776 | 6/1987 | Japan . | |
| 0036574 | 2/1988 | Japan | 357/23.7 |
| 0172469 | 7/1988 | Japan | 357/23.7 |
| 0275075 | 7/1988 | Japan . | |
| 0193568 | 8/1988 | Japan | 357/23.7 |
| 0120070 | 5/1989 | Japan | 357/23.7 |
| 1183853 | 7/1989 | Japan | 357/23.7 |

OTHER PUBLICATIONS

Seki, "Method of Matching the Gate to the Source--Drain Gap in a TFT", IBM Technical Disclosure Bulletin, vol. 7, No. 4, Sep. 1964, pp. 338-339.

Gallagher, "Amorphous Silicon Enlarges LCDs", Electronics International, vol. 55, May 1982, No. 10, pp. 94, 96.

Sze, *Physics of Semiconductor Devices*, John Wiley & Sons, 1969, pp. 568-586.

*Primary Examiner*—Olik Chaudhuri
*Assistant Examiner*—M. Wilczewski
*Attorney, Agent, or Firm*—Pollock, VandeSande and Priddy

[57] ABSTRACT

A source electrode and a drain electrode are formed apart on an insulating substrate, and a semiconductor layer is formed on the substrate between the source and drain electrodes. An insulating organic molecular film is formed all over the source and drain electrodes and the semiconductor layer. Ions are implanted into a selected top surface region of the insulating organic molecular film, corresponding to the semiconductor layer, by which chains of molecules in the surface region are cut to form free carbon, providing a conductive gate electrode.

8 Claims, 2 Drawing Sheets

METHOD OF MAKING A THIN FILM TRANSISTOR

This is a divisional of application Ser. No. 140,688 filed on Jan. 4, 1988, now U.S. Pat. No. 4,943,838.

BACKGROUND OF THE INVENTION

The present invention relates to a thin film transistor which is used, for example, as a switching element for a picture element electrode in an active liquid crystal display element. The invention also pertains to a method for the manufacture of such a thin film transistor.

A conventional thin film transistor of this kind has such a structure as shown in FIG. 1, in which source and drain electrodes 12 and 13, each formed by a transparent conductive film, for instance, are disposed apart on a transparent insulating substrate as of glass and an amorphous silicon or similar semiconductor layer 14 is deposited on the substrate 11 between the source and drain electrodes 12 and 13. The semiconductor layer 14 is covered with a gate insulating film 15, on which a gate electrode 16 is formed.

The gate insulating film 15 is formed of an inorganic insulator such as $SiN_x$ or $SiO_2$, and the gate electrode 16 is formed of a metallic material such as aluminum.

In general, the gate insulating film 15 of such an inorganic insulator is formed mostly by a plasma assisted CVD (Chemical Vapor Deposition) process. However, the plasma CVD process introduces difficulty in producing the semiconductor layer 14 of good quality because its surface is bombarded with high-energy particles.

Moreover, since the conventional thin film transistor has the structure in which the gate electrode 16 is protrusively provided on the gate insulating film 15, the surface of the transistor is relatively irregular. When such thin film transistors are used in, for example, a light crystal display element, gate buses are likely to be broken by the irregularity of the transistor array. In addition, the conventional structure requires, for the formation of the gate electrode 16, two manufacturing steps of forming a metal layer and then selectively etching it away.

As a solution to the problem involved in the formation of the gate insulating film 15 through the plasma CVD process, there has also been proposed a thin film transistor of the type employing an insulating organic molecular film as the gate insulating film 15. However, this thin film transistor also uses metal for the gate electrode 16, and hence still calls for the above-mentioned two steps for the formation of the gate electrode and suffers its protrusive structure.

SUMMARY OF THE INVENTION

It is therefore an object of the present invention to provide a thin film transistor which is relatively flat over the entire structure including gate, source and drain electrodes.

Another object of the invention is to provide a thin film transistor which does not require any etching process for formation of a gate electrode.

According to the -present invention, the gate insulating film of the thin film transistor is formed by an insulating organic molecular film and a selected region of the gate insulating film on the opposite side from the underlying semiconductor layer is rendered into a conductive layer containing free carbon, thus providing the gate electrode.

That is to say, according to the present invention, the gate insulating film is formed by an insulating organic molecular film, and through ion implantation, for example, into a selected region of the gate insulating film, chains of molecules in this region are cut to form free carbon, by which conductivity is imparted to the region, obtaining the gate electrode. In this way, the gate electrode can be obtained with such a simple process and it does not protrude from the surface of the device.

DESCRIPTION OF THE PREFERRED EMBODIMENTS

Referring first to FIGS. 2A–2E, an example of the thin film transistor of the present invention will hereinafter be described along with its manufacturing method.

Figure 2A:
FIGS. 2A–2E illustrate, in cross-section, a sequence of steps involved in the manufacture of the thin film transistor of the present invention.
Figure 2B:
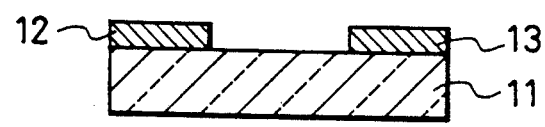
Figure 2C:
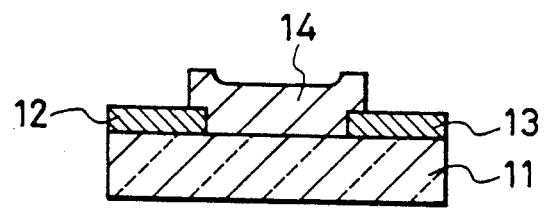

The manufacture starts with the preparation of the transparent insulating substrate 11 as of glass, such as shown in FIG. 2A. Then the source electrode 12 and the drain electrode 13, each of which is a transparent conductive film of ITO, for example, are formed apart on the substrate 11, as depicted in FIG. 2B. After this, the semiconductor layer 14 of amorphous silicon, for instance, is formed on the substrate 11 between the source and drain electrodes 12 and 13 as shown in FIG. 2C.

Figure 2D:
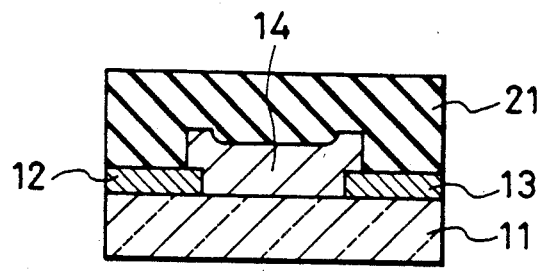

Next, in this embodiment, an insulating organic molecular film 21 of polyimide, for example, is deposited all over the surfaces of the electrodes 12 and 13 and the layer 14 as depicted in FIG. 2D. The formation of the film 21 can be achieved by use of a spinner coating, offset printing, LB (Langmuir-Blodgett), or like process. The material for the insulating organic molecular film 21 need not always be the polyimide but may also be stearic acid, diacetylene, phthalocyanine, anthracene, or the like.

Figure 2E:
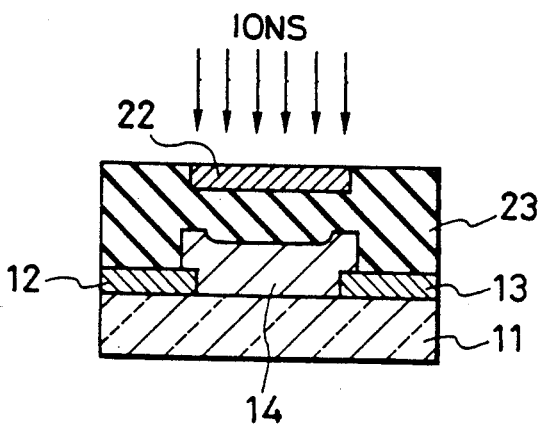

Next, as shown in FIG. 2E, for example, N+ ions are selectively implanted into the top surface of the insulating organic molecular film 21, corresponding to the semiconductor layer 14, in an amount of $1 \times 10^{17}$ ions/$cm^2$ or so with an accelerating energy of 90 KeV, by which chains of molecules in the limited upper region of the insulating organic molecular film 21 are cut to form free carbon and hence provide conductivity therein, forming a gate electrode 22. The thickness, sheet resistance, permeability and work function of the gate electrode 22 are determined according to the conditions for the ion implantation. The intermediate portion of the organic molecular film 21 between the gate electrode 22 and the semiconductor layer 14 will act as a gate insulating film 23.

Figure 1:
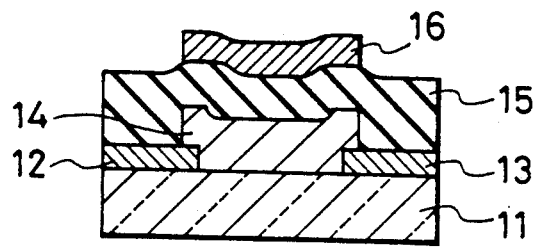
FIG. 1 is a cross-sectional view showing a conventional thin film transistor.
Figure 3:
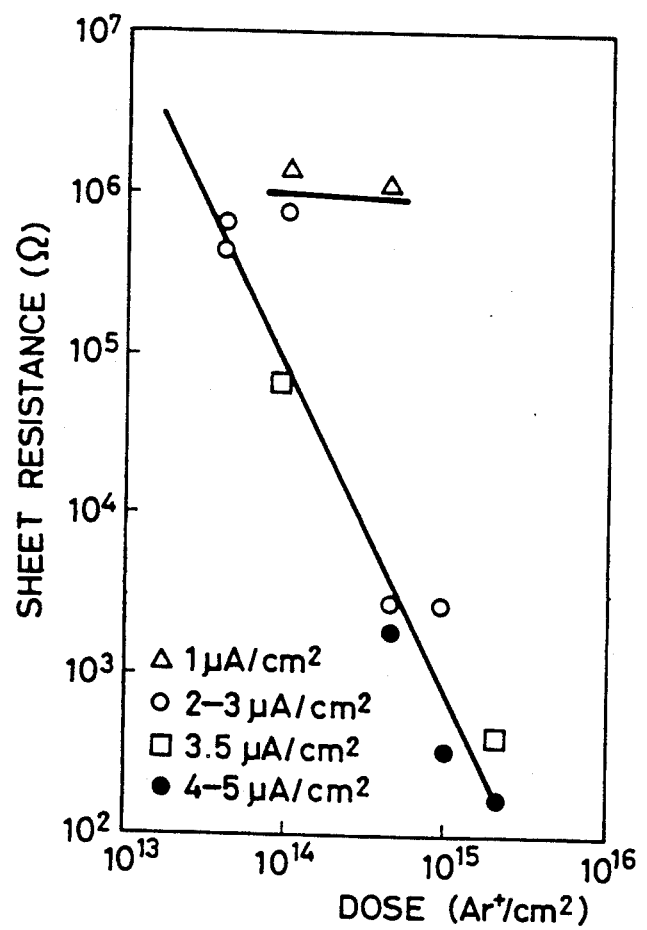
FIG. 3 is a graph showing the relationship between the amount of polyimide ions implanted and the surface resistivity.

The thicknesses of the gate electrode 22 and the gate insulating film 23 are-selected in the ranges of, for instance, from 3000 Å to 1 μm and from 1000 to 3000 Å, respectively. Accordingly, the thickness of the insulating organic molecular film 21, which is formed in the step shown in FIG. 2D, is selected substantially in the range of 4000 to 13000 Å. Incidentally, when Ar+ ions were implanted into a polyimide film with an acceleration energy of 150 KeV, the relationship between the surface resistivity of the film and the amount of ions implanted was such as shown in FIG. 3, from which it appears that the surface resistivity increases with an increase in the amount of ions implanted. Furthermore, the surface resistivity diminishes as the ion beam current density increases.

The formation of the gate electrode 22 can be achieved by ion implantation into a predetermined region through use of a mask. It is also possible to perform the ion implantation into the predetermined region, without using the mask, by controlling an ion beam for X-Y scanning.

As described above, the thin film transistor of the present invention uses an insulating organic molecular film as the gate insulating film, so that the manufacture of this thin film transistor does not involve the use of such a plasma CVD process as would be needed for the formation of an inorganic insulating film. Accordingly, the semiconductor layer 14 of good quality can be obtained.

In addition, since the region of the gate insulating film on the opposite side from the semiconductor layer 14 is rendered into a conductive region containing free carbon for use as the gate electrode, its formation can be achieved simply by ion implantation. Therefore, the manufacturing process of the thin film transistor is simple as compared with the prior art process which involves two steps of forming a metallic film and selectively etching it away, for the formation of the gate electrode.

Moreover, since the gate electrode is formed in a limited region of the surface layer of the gate insulating film, the surface of the device is less uneven than in the case where a gate electrode of metal is formed on the gate insulating film. For instance, when the thin film transistor of the present invention is employed in a liquid crystal display element, wiring such as a gate bus does not much protrude from the surface of the device. This will lessen the possibility of breakage of the wiring, ensuring enhancement of the yield rate of product.

In the case of using the thin film transistor of the present invention in the liquid crystal display element, the insulating organic molecular layer 21 is formed all over the surfaces of the underlying layers and is processed for orientation. This eliminates the necessity of providing an oriented film and makes the surface of the device less uneven.

The characteristics of the thin film transistor can be controlled as desired, by selecting the conditions for ion implantation so that the gate electrode 22 may have desired sheet resistance and work function.

It will be apparent that many modifications and variations may be effected without departing from the scope of the novel concepts of the present invention.

What is claimed is:

1. A method for the manufacture of a thin film transistor comprising the steps of:
    forming spaced source and drain electrodes on an insulating substrate;
    forming a semiconductor layer on the insulating substrate between the source and drain electrodes;
    forming an insulating organic molecular film all over the source and drain electrodes and the semiconductor layer; and
    selectively implanting ions into a region of the top surface of the insulating organic molecular film remote from the semiconductor layer, whereby chains of molecules in said surface region of the insulating organic molecular film are cut to form free carbon, providing a conductive gate electrode in said top surface.

2. The manufacturing method of claim 1, wherein the formation of the insulating organic molecular film is performed by a spinner coating, offset printing, or Langmuir-Blodgett process.

3. The manufacturing method of claim 1, wherein the ion implantation is performed by implanting N+ ions at an acceleration energy of 90 KeV.

4. The manufacturing method of claim 3 wherein the ion implantation is performed selectively for a predetermined region of said top surface of the insulating organic molecular film by control of ion beam scanning.

5. The manufacturing method of claim 1, wherein the ion implantation is performed by implanting Ar+ ions at an acceleration energy of 150 KeV.

6. The manufacturing method of claim 5 wherein the ion implantation is performed selectively for a predetermined region of said top surface of the insulating organic molecular film by control of ion beam scanning.

7. The manufacturing method of claim 1 wherein the insulating organic molecular film is formed of a material selected from the group consisting of polyimide, stearic acid, diacetylene, phthalocyanine, and anthracene.

8. The manufacturing method of claim 1 wherein the ion implantation is performed selectively for a predetermined region of said top surface of the insulating organic molecular film through use of a mask.

* * * * *